United States Patent
Wu et al.

(10) Patent No.: US 11,054,729 B2
(45) Date of Patent: Jul. 6, 2021

(54) PROJECTOR AND LASER MODULE THEREOF

(71) Applicant: Coretronic Corporation, Hsin-Chu (TW)

(72) Inventors: Chun-Hsien Wu, Hsin-Chu (TW); Kuei-Ju Weng, Hsin-Chu (TW); Chih-Hui Chang, Hsin-Chu (TW); Yu-Chang Chang, Hsin-Chu (TW); Fu-Shun Kao, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 91 days.

(21) Appl. No.: 16/579,871

(22) Filed: Sep. 24, 2019

(65) Prior Publication Data
US 2020/0096852 A1 Mar. 26, 2020

(30) Foreign Application Priority Data
Sep. 25, 2018 (CN) .......................... 201821558316.2

(51) Int. Cl.
| | |
|---|---|
| *G03B 21/16* | (2006.01) |
| *G03B 21/20* | (2006.01) |
| *H01S 5/022* | (2021.01) |
| *H01S 5/02326* | (2021.01) |
| *H01S 5/02355* | (2021.01) |
| *H01S 5/02208* | (2021.01) |
| *H01S 5/40* | (2006.01) |

(52) U.S. Cl.
CPC ......... *G03B 21/2033* (2013.01); *G03B 21/16* (2013.01); *H01S 5/02208* (2013.01); *H01S 5/02326* (2021.01); *H01S 5/02355* (2021.01); *H01S 5/4025* (2013.01)

(58) Field of Classification Search
CPC ...... H01S 5/022; H01S 5/02208; H01S 5/023; H01S 5/4025; G03B 21/14; G03B 21/16; G03B 21/2033
USPC ..................................... 372/34–36
See application file for complete search history.

(56) References Cited

U.S. PATENT DOCUMENTS

| | | | |
|---|---|---|---|
| 8,718,109 B2 | 5/2014 | Saruwatari et al. | |
| 2015/0355533 A1* | 12/2015 | Masuda | H01S 5/02469 353/52 |
| 2016/0077418 A1* | 3/2016 | Yamamoto | G03B 21/2013 353/31 |
| 2016/0204572 A1* | 7/2016 | Wu | G02B 6/42 359/639 |

(Continued)

FOREIGN PATENT DOCUMENTS

TW 200849749 A 12/2008

*Primary Examiner* — William C. Dowling

(57) ABSTRACT

A projector includes an optical engine module, a projection lens module, a heat dissipation module, and a laser module. The laser module includes a positioning member and a laser unit fixed to the positioning member, wherein a positioning member includes a main plate portion and two shoulder portions, the main plate portion includes a first upper surface and a first lower surface opposite to each other, a first front surface and a first rear surface opposite to each other, and a first left side surface and a first right side surface opposite to each other, and the two shoulder portions extend on a plane of the first upper surface from the first left side surface and the first right side surface of the main plate portion, respectively. A laser module is also provided.

26 Claims, 10 Drawing Sheets

(56) References Cited

U.S. PATENT DOCUMENTS

2019/0227415 A1\* 7/2019 Aruga .................... G03B 21/16

\* cited by examiner

PROJECTOR AND LASER MODULE THEREOF

CROSS-REFERENCE TO RELATED APPLICATION

THIS APPLICATION CLAIMS THE PRIORITY BENEFIT OF CHINA APPLICATION (CN201821558316.2 FILED ON 2018 Sep. 25). THE ENTIRETY OF THE ABOVE-MENTIONED PATENT APPLICATION IS HEREBY INCORPORATED BY REFERENCE HEREIN AND MADE A PART OF THIS SPECIFICATION.

FIELD OF THE INVENTION

The invention relates to a projector, and more particularly to a projector with a laser module which can be easily disassembled and assembled and a laser module thereof.

BACKGROUND OF THE INVENTION

With the development of technology, the laser technology has gradually matured and the projector's light source system has begun to use laser as a light source. With the high focus, wavelength selectivity and high spectral brightness of the laser source, the projector can display high-quality images with large screen and high resolution.

In the assembly process of the projector, the laser light source module is assembled and fixed together with the heat dissipation module and the optical engine module. When the laser light source module needs to be repaired or replaced, in addition to removing the laser light source module and the heat dissipation module from the optical engine module, the circuit board or the casing of the projector needs to be removed so that the laser light source module can be replaced. The process of disassembly and assembly is complicated and time consuming; as such the replacement of the laser light source module is difficult and costly. In addition, the structure of the laser light source module is complicated, and therefore it is easy to cause assembly failure and the yield is low.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a projector and a laser module thereof. When being replaced, the laser module can be easily separated from the optical engine module and the heat dissipation module of the projector, thereby reducing the disassembly time and the complexity of disassembly and assembly.

Other objectives and advantages of the invention can be further understood from the technical features disclosed in the invention.

In order to achieve one or a part or all of the above objectives or other objectives, an embodiment of the invention provides a laser module for a projector. The laser module includes a positioning member and a laser unit. The positioning member includes a main plate portion and two shoulder portions. The main plate portion includes a first upper surface and a first lower surface opposite to each other, a first front surface and a first rear surface opposite to each other, and a first left side surface and a first right side surface opposite to each other. The two shoulder portions extend on a plane of the first upper surface from the first left side surface and the first right side surface of the main plate portion, respectively. The laser unit is disposed on the first front surface of the main plate portion.

In order to achieve one or a part or all of the above objectives or other objectives, an embodiment of the invention provides a projector, which includes an optical engine module, a projection lens module, a heat dissipation module and a laser module. The projection lens module is fixed to one side of the optical engine module. A positioning groove is disposed between the heat dissipation module and the light engine module. The laser module is replaceably fixed in the positioning groove. The laser module includes a positioning member and a laser unit. The positioning member includes a main plate portion and two shoulder portions. The main plate portion includes a first upper surface and a first lower surface opposite to each other, a first front surface and a first rear surface opposite to each other, and a first left side surface and a first right side surface opposite to each other. The two shoulder portions extend on a plane of the first upper surface from the first left side surface and the first right side surface of the main plate portion, respectively. The laser unit is fixed to the positioning member.

In summary, in the projector of the embodiment, the projector is assembled such that the optical engine module and the heat dissipation module are assembled to form a positioning groove between each other. The positioning groove is used for placing the laser module, so that the laser module can be easily separated from and inserted into the positioning groove when the laser module is replaced. As such, the disassembly of the projector is simple, and the various modules of the projector are not required to be disassembled, thereby reducing the disassembly and assembly time and reducing the assembly and disassembly complexity.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
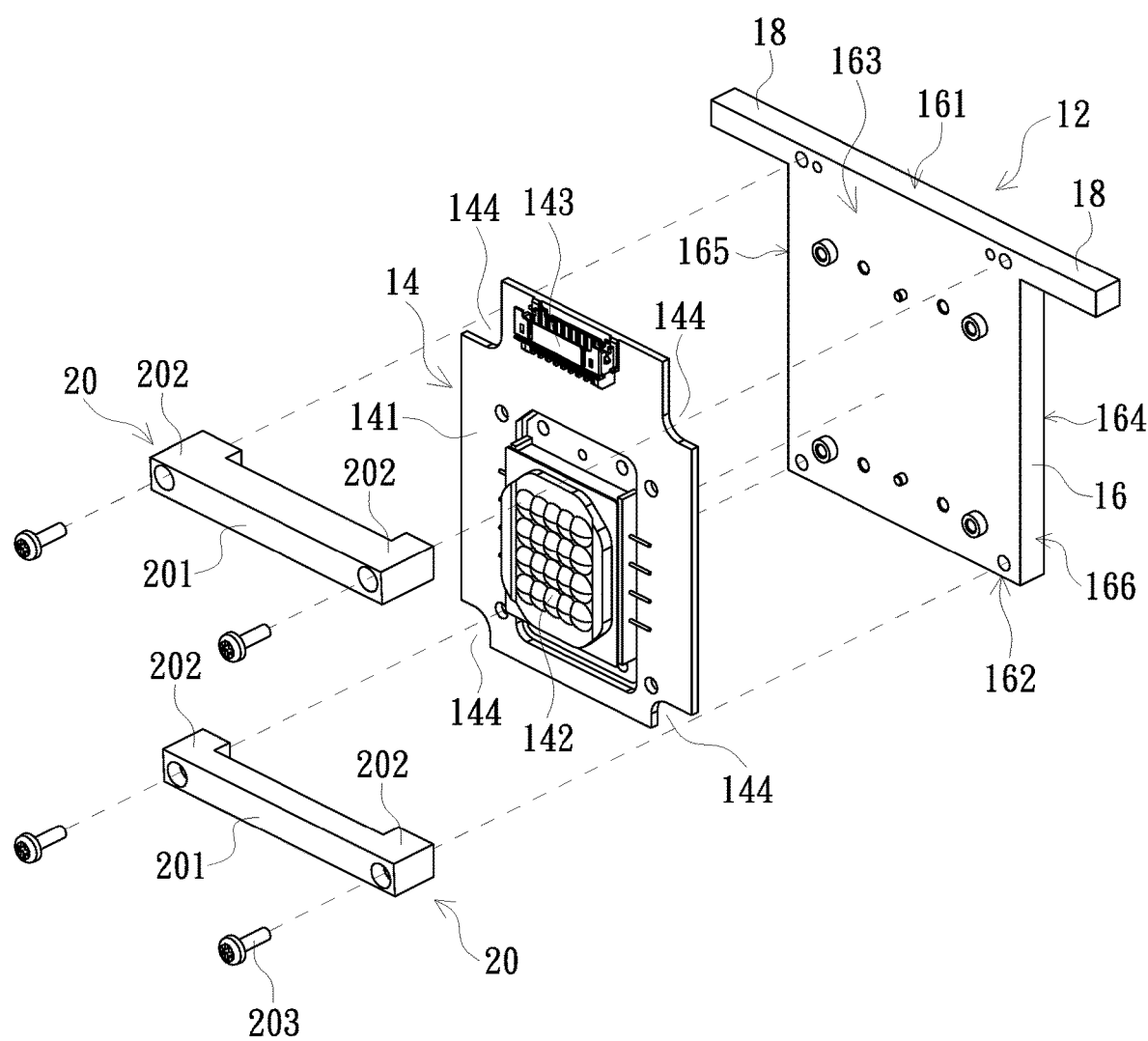
FIG. 1 is an exploded view of a laser module according to a first embodiment of the invention.
Figure 2:
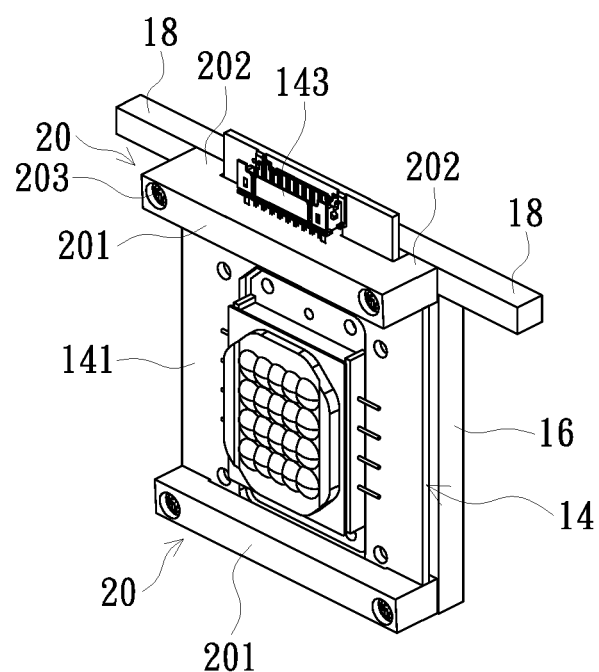
FIG. 2 is an assembly view of the laser module shown in FIG. 1.

FIG. 1 is an exploded view of a laser module according to a first embodiment of the invention, and FIG. 2 is an assembly view of the laser module shown in FIG. 1. As shown in FIG. 1, the laser module 10 includes a positioning member 12 and a laser unit 14. The positioning member 12 includes a main plate portion 16 and two shoulder portions 18. In an embodiment, the main plate portion 16 is slightly elongated shape and includes a first upper surface 161 and a first lower surface 162 opposite to each other, a first front surface 163 and a first rear surface 164 opposite to each other, and a first left side surface 165 and a first right side surface 166 opposite to each other. The two shoulder portions 18 extend from the first left side surface 165 and the first right side surface 166 of the main plate portion 16 in the plane on the first upper surface 161 to protrude horizontally from the first left side surface 165 and the first right side surface 166, respectively. The laser unit 14 is disposed on the first front surface 163 of the main plate portion 16.

Following the above description, in an embodiment, the laser unit 14 includes a circuit unit 141, a plurality of laser diodes 142, and a connection unit 143. The circuit unit 141 is, for example, a circuit board having a circuit layout. The laser diodes 142 are disposed on the circuit unit 141 and electrically connected to the circuit unit 141. The connection unit 143 is, for example, an electronical connector, disposed on the circuit unit 141 and electrically connected to the circuit unit 141. In an embodiment, the connection unit 143 is disposed at the upper end edge of the circuit unit 141 for connecting to a power source (not shown) by using a corresponding connection unit (not shown). As shown in FIG. 2, when the laser unit 14 is disposed on the first front surface 163 of the main plate portion 16, the upper end edge of the circuit unit 141 slightly protrudes from the shoulder portions 18, so that the connection unit 143 is disposed at a position slightly higher than the shoulder portions 18.

In an embodiment, the laser module 10 further includes at least one fixing member 20. As shown in FIGS. 1 and 2, the number of the fixing members 20 is, for example, two. Each of the fixing members 20 includes a fixing portion 201 and two side arms 202. The two side arms 202 are disposed at the two opposite ends of the fixing portion 201, respectively. Correspondingly, the notches 144 are respectively formed at four corners of the upper and lower ends of the circuit unit 141. Please also refer to FIG. 2, the fixing portions 201 of the two fixing members 20 are respectively crosswisely disposed on the upper and lower ends of the circuit unit 141 and the side arms 202 each pass through the corresponding notch 144 and are locked to the main plate portion 16 by the corresponding screw 203, so that the laser unit 14 is fixed to the main plate portion 16 by the two fixing members 20, wherein the connection unit 143 is located above the upper fixing member 20. However, the fixing manner of the circuit unit 14 is not limited thereto. In another embodiment, the laser module 10 further includes a thermal conductive adhesive layer (not shown) disposed between the laser unit 14 and the main plate portion 16 and used for attaching the laser unit 14 to the main plate portion 16.

The first left side surface 165 and the first right side surface 166 of the main plate portion 16 are substantially parallel to each other, but the invention is not limited thereto. In another embodiment, at least one of the first left side surface 165 and the first right side surface 166 is inclined with respect to the other, such that the distance between the first left side surface 165 and the first right side surface 166 is gradually reduced in the direction from the first upper surface 161 to the first lower surface 162 of the main plate portion 16.

Figure 3:
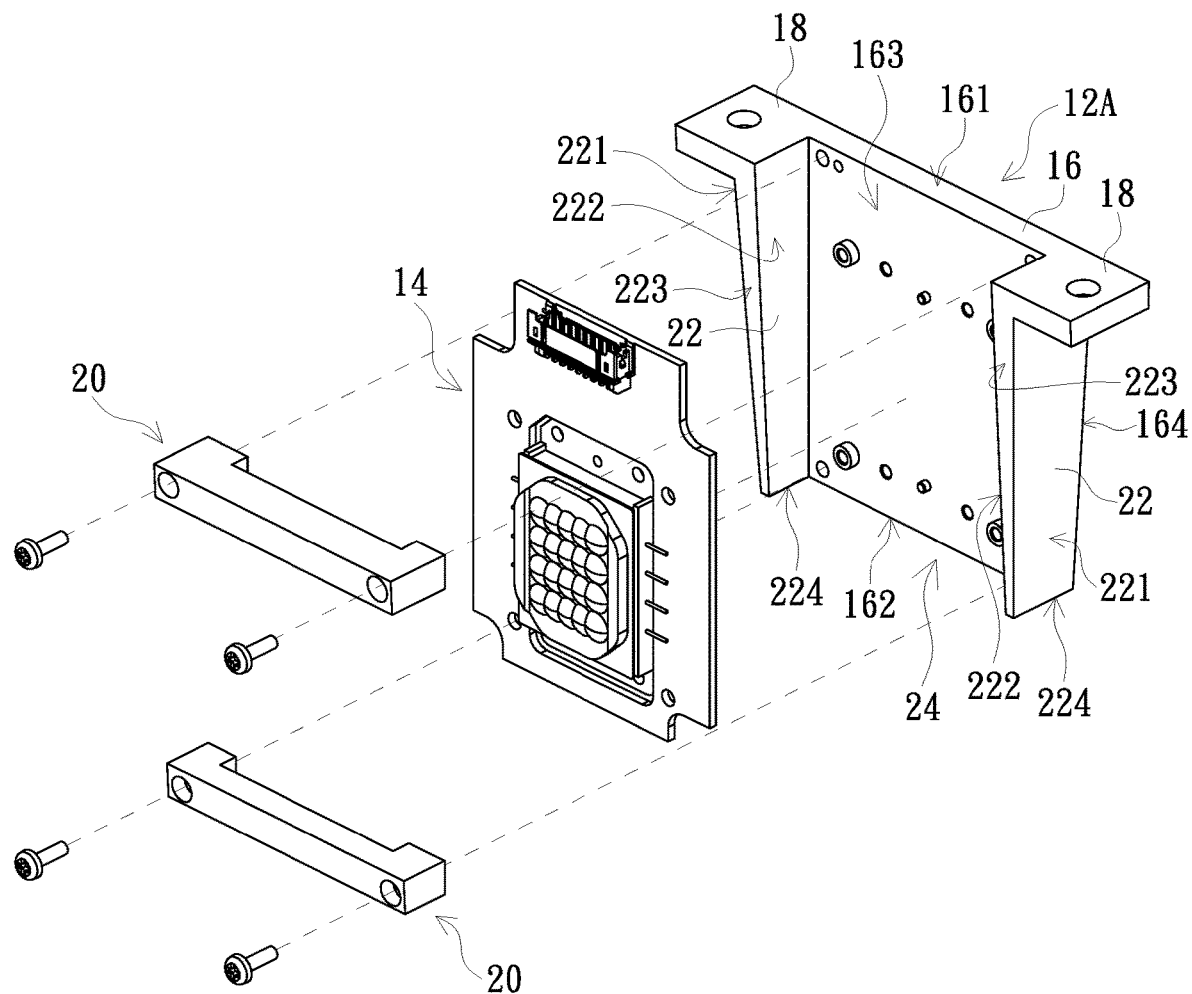
FIG. 3 is an exploded view of a laser module according to a second embodiment of the invention.
Figure 4:
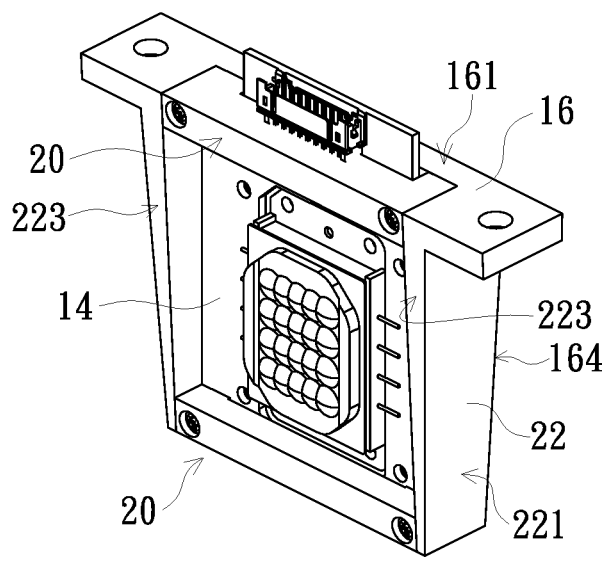
FIG. 4 is an assembly view of the laser module shown in FIG. 3.

FIG. 3 is an exploded view of a laser module according to a second embodiment of the invention, and FIG. 4 is an assembly view of the laser module shown in FIG. 3. As shown in FIG. 3, the laser module 10A includes a positioning member 12A and a laser unit 14. The difference between the second embodiment and the first embodiment is that the positioning member 12A further includes two side plate portions 22. The two side plate portions 22 extend from the first rear surface 164 to the first front surface 163 of the main plate portion 16 along the first left side surface 165 (shown in FIG. 1) and the first right side surface 166 (shown in FIG. 1), respectively. The two side plate portions 22 are connected to the two shoulder portions 18, respectively. The two side plate portions 22 and the main plate portion 16 form a recess 24. As shown in FIG. 4, the laser unit 14 is disposed on the first front surface 163 of the main plate portion 16 and is located in the recess 24. Further, the structure of the laser unit 14 and the manner in which the laser unit 14 is fixed to the main plate portion 16 by the two fixing members 20 are substantially the same as those of the first embodiment, and no redundant detail is to be given herein.

Figure 5:
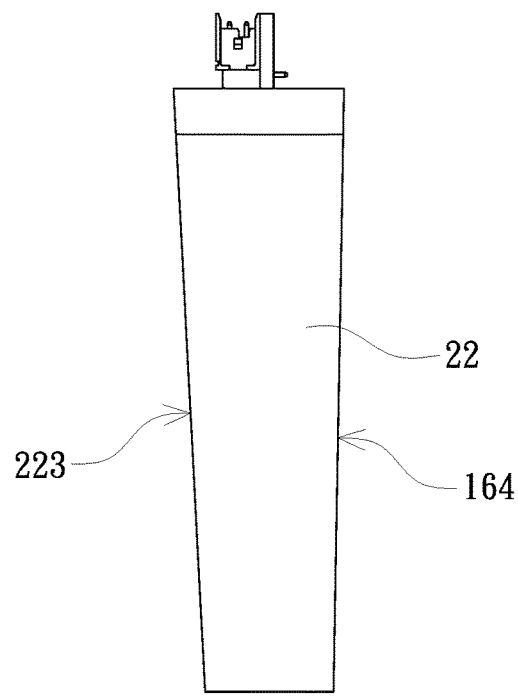
FIG. 5 is a side view of the laser module shown in FIG. 4.

Following the above description, as shown in FIGS. 3 and 4, each side plate portion 22 includes a second outer surface 221 and a second inner surface 222 opposite to each other, a second front surface 223, and a second lower surface 224. The two second inner surfaces 222 of the two side plate portions 22 face each other, and the recess 24 is positioned between the two second inner surfaces 222. FIG. 5 is a side view of the laser module shown in FIG. 4. In an embodiment as shown in FIGS. 4 and 5, the second front surfaces 223 of the two side plate portions 22 are coplanar, and the second front surfaces 223 of the two side plate portions 22 are inclined with respect to the first rear surface 164 of the main plate portion 16, such that the distance between the second front surface 223 and the first rear surface 164 is gradually reduced along the direction from the first upper surface 161 (shown in FIG. 3) to the first lower surface 162 (shown in FIG. 3) of the main plate portion 16, but the invention is not limited thereto. In another undrawn embodiment, the second front surfaces 223 of the two side plate portions 22 are coplanar and substantially parallel with the first rear surface 164 of the main plate portion 16.

Figure 6:
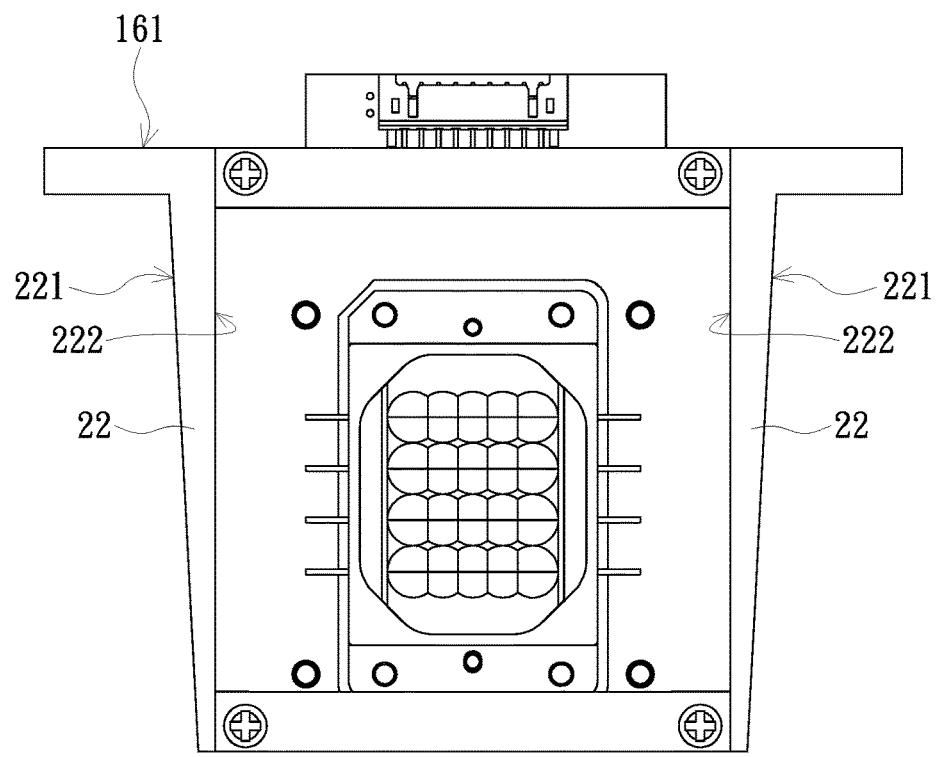
FIG. 6 is a front view of the laser module shown in FIG. 4.

In still another embodiment as shown in FIGS. 3 and 4, at least one of the second outer surfaces 221 of the two side plate portions 22 is inclined with respect to the other, such that the distance between the two second outer surface 221 is gradually reduced along the direction from the first upper surface 161 to the first lower surface 162 of the main plate portion 16. For example, FIG. 6 is a front view of the laser module shown in FIG. 4. As shown in FIGS. 4 and 6, the two second inner surfaces 222 of the two side plate portions 22 are parallel to each other and perpendicular to the first upper surface 161 of the main plate portion 16, and the two second outer surfaces 221 of the two side plate portions 22 are each inclined with respect to the corresponding first inner surface 222, such that the thickness of each side plate portion 22 is gradually reduced along the direction from the first upper surface 161 to the first lower surface 162 (shown in FIG. 3) of the main plate portion 16, and therefore, the distance between the two second outer surfaces 221 of the two side plate portions 22 is gradually reduced along the direction from first upper surface 161 to the first lower surface 162 of the main plate portion 16, but the invention is not limited thereto. In another undrawn embodiment, the two second outer surfaces 221 of the two side plate portions 22 are substantially parallel to each other.

Figure 7:
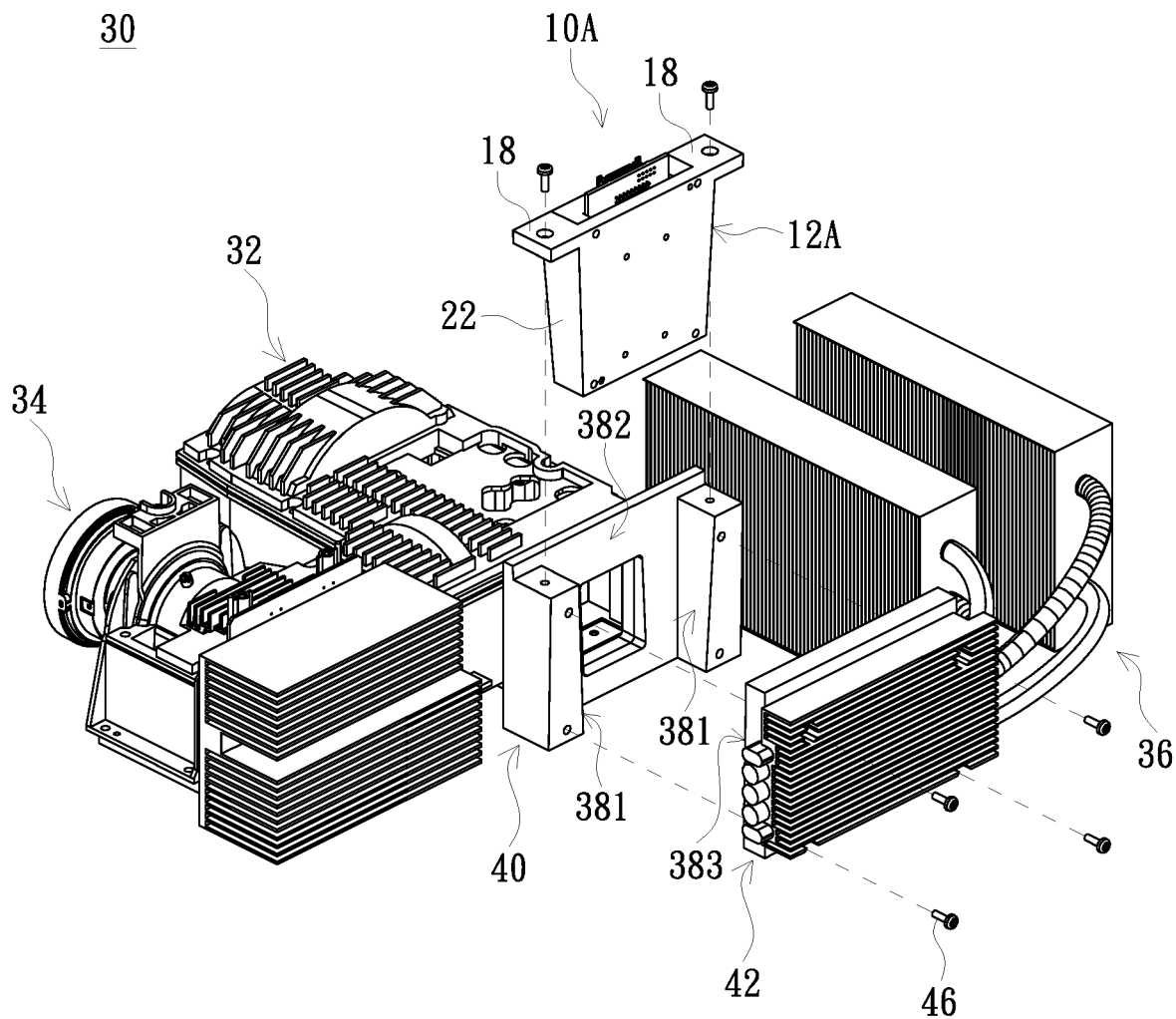
FIG. 7 is a partially exploded view of a projector according to an embodiment of the invention.
Figure 8:
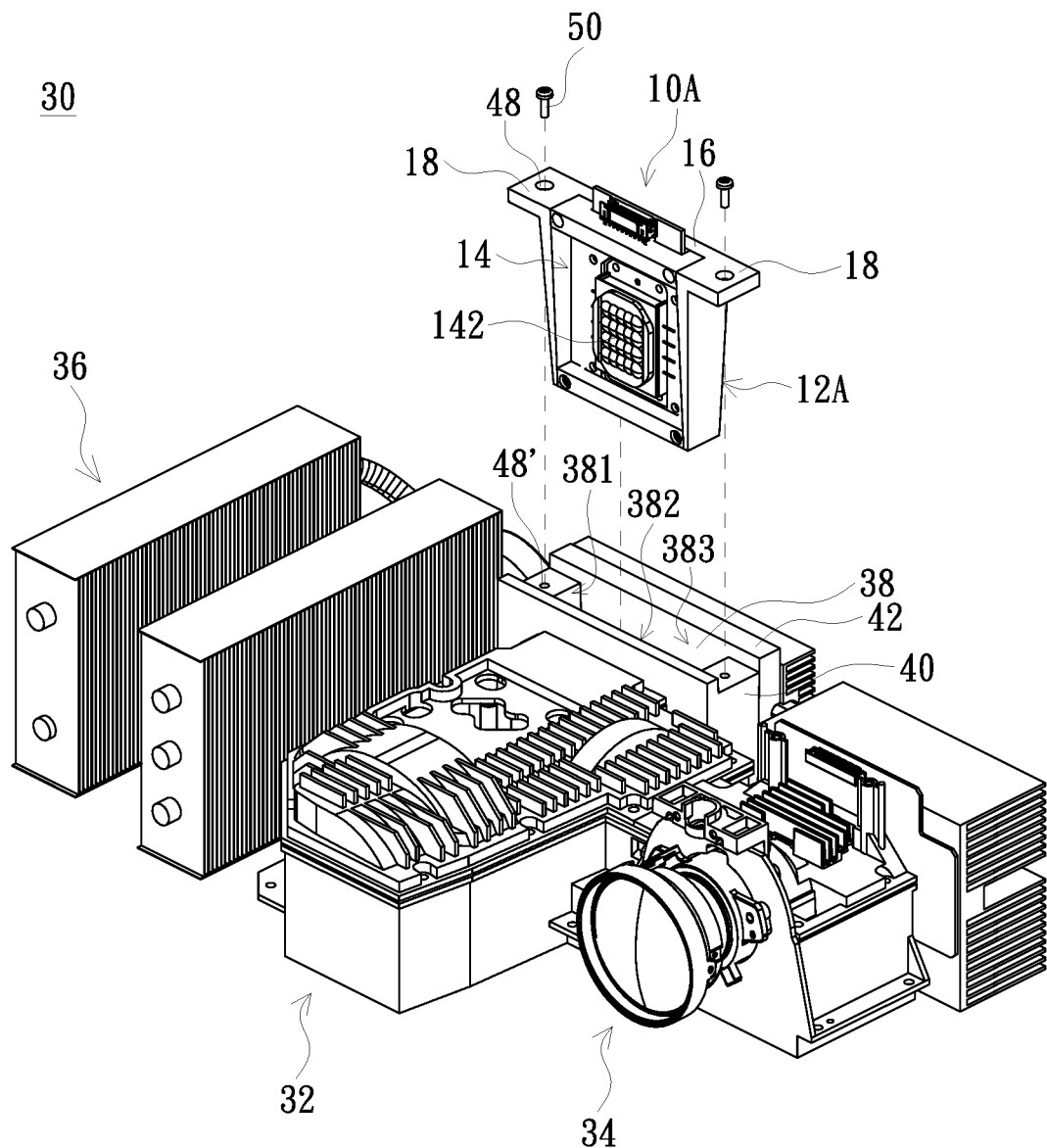
FIG. 8 is a partial assembly view of the projector shown in FIG. 7.
Figure 9:
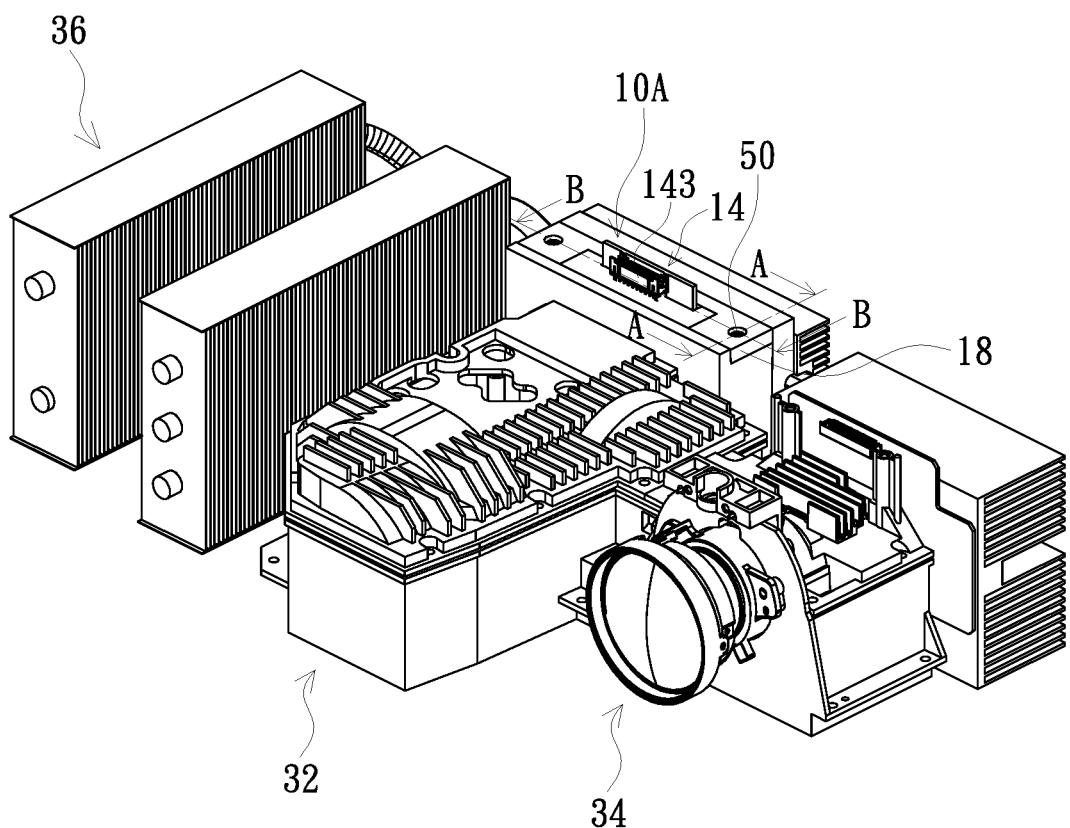
FIG. 9 is a schematic view of the assembled projector shown in FIG. 7.

The laser modules 10, 10A of the first and second embodiments described above are detachably and alternatively assembled in the projector by the design of the positioning members 12, 12A. FIG. 7 is a partially exploded view of a projector according to an embodiment of the invention, FIG. 8 is a partial assembly view of the projector shown in FIG. 7, and FIG. 9 is a schematic view of the assembled projector shown in FIG. 7. As shown in FIGS. 7, 8 and 9, the projector 30 includes an optical engine module 32, a projection lens module 34, a heat dissipation module 36, and a laser module 10A. The projection lens module 34 is fixed on one side of the optical engine module 32. A positioning groove 38 (shown in FIG. 8) is disposed between the heat dissipation module 36 and the optical engine module 32. In an embodiment as shown in FIG. 7, the optical engine module 32 includes a laser module mounting portion 40, and the heat dissipation module 36 includes a laser module heat dissipation portion 42. The laser module heat dissipation portion 42 is locked to the laser module mounting portion 40 of the optical engine module 32 by a plurality of screws 46 as shown in FIG. 8, such that the positioning groove 38 between the optical engine module 32 and the heat dissipation module 36 is formed at least partially by the laser module mounting portion 40 and the laser module heat dissipation portion 42. The laser module 10A is fixed in the positioning groove 38 by the two shoulder portions 18 of the positioning member 12A. In the projector 30 of the embodiment, the laser module 10A in which the positioning member 12A having the two side plate portions 22 is used. In an embodiment, internally threaded bores 48, 48' are provided in each of the shoulder portions 18 and a position of the positioning groove 38 corresponding to the shoulder portion 18 respectively, so that the shoulder portions 18 are connected to the positioning groove 38 by a plurality of screws 50 and the laser module 10A is inserted into the positioning groove 38. The laser diode 142 (shown in FIG. 8) of the laser unit 14 of the laser module 10A faces the optical engine module 32, and the connection unit 143 of the laser unit 14 is exposed to the positioning groove 38. The shoulder portions 18 can be aligned with the positioning groove 38, but are not limited thereto. In an embodiment, the shoulder portions 18 can protrude from the positioning groove 38, such that it is more convenient to make the laser module 10A detachable for replacement.

Figure 10:
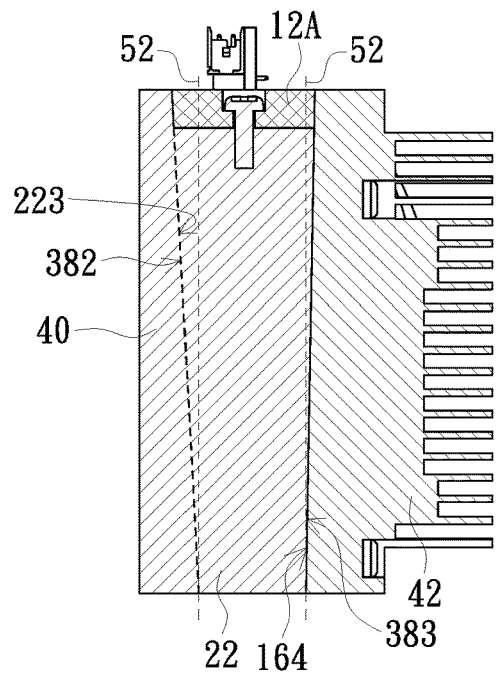
FIG. 10 is a cross-sectional view taken along line A-A of FIG. 9.
Figure 11:
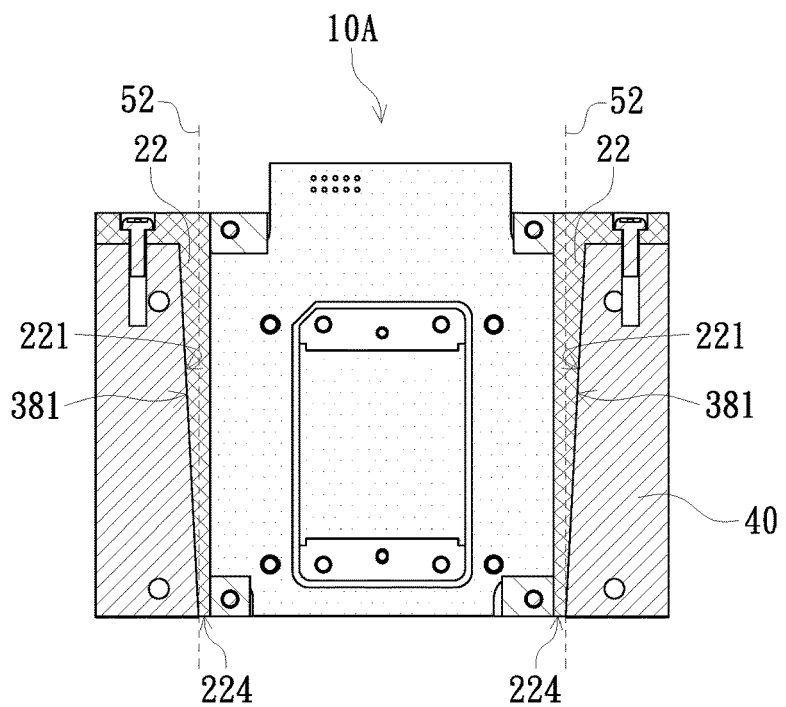
FIG. 11 is a cross-sectional view taken along line B-B of FIG. 9.

Following the above description, FIG. 10 is a cross-sectional view taken along line A-A of FIG. 9, and FIG. 11 is a cross-sectional view taken along line B-B of FIG. 9. As shown in FIG. 10, the second front surface 223 of the side plate portion 22 contacts the surface 382 (also shown in FIGS. 7 and 8) of the positioning groove 38 when the laser module 10A is fixed in the positioning groove 38 by the shoulder portions 18, wherein the surface 382 is part of the laser module mounting portion 40. At the same time or alternatively, as shown in FIG. 11, the positioning groove 38 includes a plurality of surfaces 381 (shown in FIGS. 7 and 8) that match the inclination angles of the two second outer surfaces 221 of the two side plate portions 22, such that the surfaces 381 of the positioning groove 38 closely contact the second outer surfaces 221 of the two side plate portions 22 when the laser module 10A is fixed in the positioning groove 38. In an embodiment, the lengths of the main plate portion 16 (shown in FIG. 8) and the side plate portion 22 are slightly shorter than the depth of the positioning groove 38 based on the consideration of tolerances of the assembly of the laser module 10A and the positioning groove 38, such that the first lower surface 162 of the main plate portion 16 and the second lower surface 224 of the side plate portion 22 have a gap with the bottom of the positioning groove 38 when the laser module 10A is inserted into the positioning groove 38.

The cross-sectional views shown in FIGS. 10 and 11 are drawn based on the positioning member 12A of the laser module 10A having the side plate portion 22, but are not limited thereto. In an undrawn embodiment, when the first embodiment in which the laser module 10 is fixed in the positioning groove 38 is employed, the positioning groove 38 includes a plurality of surfaces matching the inclination angles of the first left side surface 165 and the first right side surface 166, as such the surfaces 381 of the positioning groove 38 closely contact the first left side surface 165 and the first right side surface 166 when the laser module 10 is fixed in the positioning groove 38.

In the embodiment shown in FIG. 10, the second front surface 223 of the side plate portion 22 and the first rear surface 164 of the main plate portion 12A both have inclination angles with respect to the vertical axis 52, and the surface 382 of the positioning groove 38 that is in contact with the second front surface 223 and the surface 383 of the positioning groove 38 that is in contact with the first rear surface 164 also have matching inclination angles, respectively. The surface 383 is a part of the laser module heat dissipation portion 42 of the heat dissipation module 36. The first rear surface 164 can be closely attached to the laser module heat dissipation portion 42 due to the first rear surface 164 and the surface 383 have the same inclination angle, but the invention is not limited thereto. In an embodiment as shown in FIG. 12, the second front surface 223 of the side plate portion 22 still has an inclination angle with respect to the vertical axis 52, and the first rear surface 164B is not inclined but parallel to the vertical axis 52, such that the surface 383B of the positioning groove 38 that is in contact with the first rear surface 164B is also not inclined, so that the first rear surface 164B can be closely attached to the laser module heat dissipation portion 42.

Figure 12:
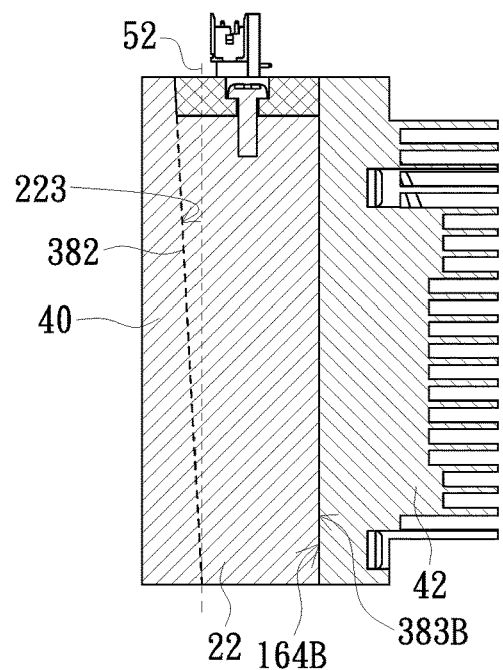
FIG. 12 is a partial cross-sectional view of a laser module, an optical engine module, and a heat dissipation module of a projector according to another embodiment of the invention.

In the embodiment shown in FIGS. 10 and 12, the second front surface 223 of the side plate portion 22 has a matching inclination angle with the surface 382 of the positioning groove 38, and the second front surface 223 is in inclined contact with the surface 382 of the positioning groove 38, such that the positioning member 12A is in close contact with the laser module heat dissipation portion 42 of the heat dissipation module 36 when the laser module 10A is assembled in the positioning groove 38, so that the heat dissipation of the laser module 10A can achieve a better effect of heat dissipation.

Figure 13:
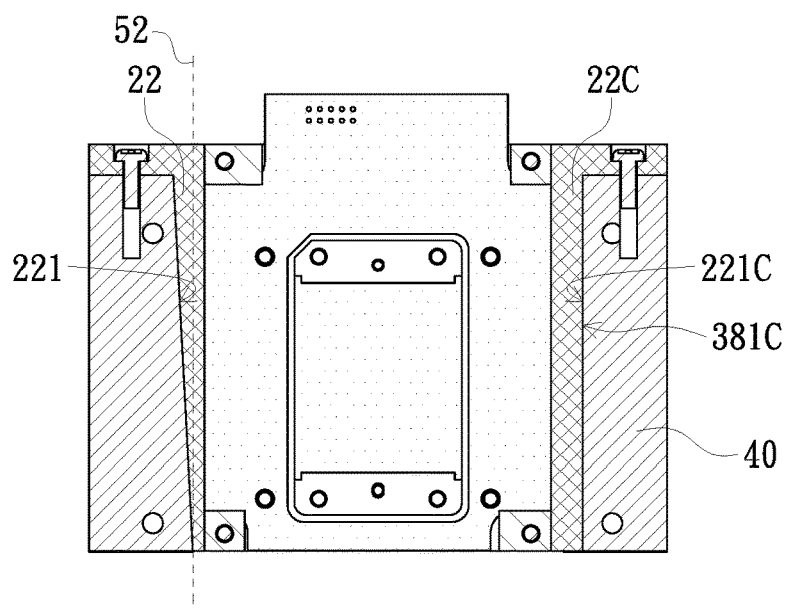
FIG. 13 is a partial cross-sectional view of a laser module and an optical engine module of a projector according to another embodiment of the invention.

In the embodiment shown in FIG. 11, the two second outer surfaces 221 of the two side plate portions 22 both have inclination angles with respect to the vertical axis 52, and the surface 381 of the positioning groove 38 that is in contact with the two second outer surfaces 221 also have matching inclination angles. The surface 381 is a part of the laser module mounting portion 40. The two second outer surfaces 221 can be closely attached to the laser module mounting portion 40 due to the two second outer surfaces 221 and the surface 381 have the same inclination angle so as to achieve the effect of the laser module 10A being positioned in the positioning groove 38, but the invention is not limited thereto. In an embodiment as shown in FIG. 13, the second outer surface 221 of the side plate portion 22 has an inclination angle with respect to the vertical axis 52, and the second outer surface 221C of the other side plate portion 22C is not inclined but parallel to the vertical axis 52, such that the surface 381C of the positioning groove 38 that is in contact with the second outer surface 221C is also not inclined, so that the second outer surfaces 221, 221C can be closely attached to the laser module mounting portion 40.

The above embodiment is exemplified by the positioning member 12A having two side plate portions 22. The two second front surfaces 223 and the two second outer surfaces 221 of the positioning member 12A are in contact with the laser module mounting portion 40 of the optical engine module 32, and the first rear surface 164 of the positioning member 12A is in contact with the laser module heat dissipation portion 42 of the heat dissipation module 36. The contact surface of the laser module 10A to the laser module mounting portion 40 can be inclined. For example, the second front surface 223 and the second outer surface 221 are inclined surfaces, and the surface 382 and the surface 381 are matching inclined surfaces, such that the laser module mounting portion 40 is used as a positioning reference when the laser module 10A and the positioning groove 38 are assembled. Or, the contact surface of the laser module 10A to the laser module heat dissipation portion 42 may have a slope. For example, the first rear surface 164 is an incline plane and the surface 383 is a matching incline plane, such that the laser module heat dissipation portion 42 is used as a positioning reference when the laser module 10A and the positioning groove 38 are assembled. Or, a part of the contact surface of the laser module 10A to the laser module mounting portion 40 and the laser module heat dissipation portion 42 may have a slope. For example, the second front surface 223 or the first rear surface 164 is an incline plane, and one of the two second outer surfaces 221 is a matching incline plane, and the assembly positioning effect of the laser module 10A in the positioning groove 38 can also be achieved.

Following the above description, in an embodiment, the hardness of the laser module heat dissipation portion 42 of the heat dissipation module 36 is greater than the hardness of the positioning member 12/12A, and the hardness of the laser module mounting portion 40 of the optical engine module 32 is greater than the hardness of the positioning member 12/12A. As such, the slight deform of the positioning groove 38 caused by the slightest interference between the size difference of the positioning member 12/12A and the positioning groove 38 due to the manufacturing tolerances of the positioning member 12/12A and the positioning groove 38 is avoided.

In addition, the projector 30 of an embodiment of the invention may further include a dustproof material (not shown) disposed above the laser module 10/10A to cover the laser module 10/10A and the positioning groove 38, so as to avoid dust entering the positioning groove 88 or contaminating the laser module 10/10A to affect the brightness or other projection effects of the projector. In an embodiment, the dustproof material may be made of foam, rubber or other material that can achieve a compressed airtight effect.

In summary, in the projector of the embodiment, the projector is assembled such that the optical engine module and the heat dissipation module are assembled to form a positioning groove between each other. The positioning groove is used for placing the laser module, so that the laser module can be easily separated from and inserted into the positioning groove when the laser module is replaced. As such, the disassembly of the projector is simple, and the various modules of the projector are not required to be disassembled, thereby reducing the disassembly and assembly time and reducing the assembly and disassembly complexity.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first lower surface, the second lower surface, the first front surface and the second front surface are only used for distinguishing various elements and do not limit the number of the elements.

What is claimed is:

1. A laser module for a projector, and the laser module comprising:
   a positioning member, comprising a main plate portion and two shoulder portions, wherein the main plate portion comprises a first upper surface and a first lower surface opposite to each other, a first front surface and a first rear surface opposite to each other, and a first left side surface and a first right side surface opposite to each other, and the two shoulder portions extend on a plane of the first upper surface from the first left side surface and the first right side surface of the main plate portion, respectively; and
   a laser unit, disposed on the first front surface of the main plate portion.

2. The laser module according to claim 1, wherein the laser unit comprises:
   a circuit unit;
   a plurality of laser diodes, disposed on the circuit unit and electrically connected to the circuit unit; and
   a connection unit, disposed on the circuit unit and electrically connected to the circuit unit, wherein the connection unit is further electrically connected to a power source.

3. The laser module according to claim 1, further comprising at least one fixing member, wherein the fixing member comprises a fixing portion and two side arms, the two side arms are disposed on opposite ends of the fixing portion, respectively, the fixing portion is disposed on the laser unit, and the two side arms are fixed to the main plate portion to fix the laser unit to the main plate portion.

4. The laser module according to claim 1, further comprising a thermal conductive adhesive layer disposed between the laser unit and the main plate portion to attach the laser unit to the main plate portion.

5. The laser module according to claim 1, wherein the first left side surface and the first right side surface of the positioning member are substantially parallel to each other.

6. The laser module according to claim 1, wherein at least one of the first left side surface and the first right side surface of the positioning member is inclined with respect to the other, such that a distance between the first left side surface and the first right side surface is gradually reduced in a direction from the first upper surface to the first lower surface of the main plate portion.

7. The laser module according to claim 1, wherein the positioning member further comprises two side plate portions extending from the first rear surface of the main plate portion to the first front surface along the first left side surface and the first right side surface, respectively, the two side plate portions and the main plate portion form a recess, and the recess is configured to accommodate the laser unit.

8. The laser module according to claim 7, wherein each of the side plate portions comprises an opposite second outer surface and a second inner surface, a second front surface and a second lower surface, the two second inner surfaces of the two side plate portions face each other, and the recess is positioned between the two second inner surfaces.

9. The laser module according to claim 8, wherein the two second front surfaces of the two side plate portions are coplanar and substantially parallel to the first rear surface of the main plate portion.

10. The laser module according to claim 8, wherein the two second front surfaces of the two side plate portions are inclined with respect to the first rear surface of the main plate portion, such that a distance between the second front surface and the first rear surface is gradually reduced in a direction from the first upper surface to the first lower surface of the main plate portion.

11. The laser module according to claim 9, wherein the two second outer surfaces of the two side plate portions are substantially parallel to each other.

12. The laser module according to claim 10, wherein the two second outer surfaces of the two side plate portions are substantially parallel to each other.

13. The laser module according to claim 9, wherein at least one of the two second outer surfaces of the two side plate portions is inclined with respect to the other, such that a distance between the two outer surface is gradually reduced in a direction from the first upper surface to the first lower surface of the main plate portion.

14. The laser module according to claim 10, wherein at least one of the two second outer surfaces of the two side plate portions is inclined with respect to the other, such that a distance between the two outer surface is gradually reduced in a direction from the first upper surface to the first lower surface of the main plate portion.

15. The laser module according to claim 1, wherein the laser module is replaceably assembled in the projector, the projector comprises an optical engine module and a heat dissipation module, a positioning groove is disposed between the optical engine module and the heat dissipation modules for inserting the laser module, and the laser module is fixed in the positioning groove by the shoulder portion of the positioning member.

16. The laser module according to claim 15, wherein the laser module being fixed in the positioning groove by the shoulder portion of the positioning member is realized by forming an internally threaded bore in each of the shoulder portion of the positioning member and a corresponding portion of the positioning groove, such that the shoulder portion of the positioning member is connected to the positioning groove by a screw.

17. The laser module according to claim 15, wherein the projector further comprises a dustproof material disposed above the laser module, and the dustproof material covers at least the laser module and the positioning groove.

18. A projector, comprising:
an optical engine module;
a projection lens module, fixed to one side of the optical engine module;
a heat dissipation module, wherein a positioning groove is disposed between the heat dissipation module and the light engine module; and
a laser module, replaceably fixed in the positioning groove, wherein the laser module comprises:
a positioning member, comprising a main plate portion and two shoulder portions, wherein the main plate portion comprises a first upper surface and a first lower surface opposite to each other, a first front surface and a first rear surface opposite to each other, and a first left side surface and a first right side surface opposite to each other, and the two shoulder portions extend on a plane of the first upper surface from the first left side surface and the first right side surface of the main plate portion, respectively; and
a laser unit, fixed to the positioning member.

19. The projector according to claim 18, wherein the optical engine module comprises a laser module mounting portion, the heat dissipating module comprises a laser module heat dissipating portion, and the positioning groove disposed between the optical engine module and the heat dissipation module is at least particially formed by the laser module mounting portion of the optical engine module and the laser module heat dissipation portion of the heat dissipation module.

20. The projector according to claim 19, wherein the laser unit is fixed to the first front surface of the positioning member, and the first rear surface of the positioning member contacts the laser module heat dissipation portion of the heat dissipation module.

21. The projector according to claim 20, wherein the first left side surface of the positioning member is substantially parallel or inclined with respect to the first right side surface, the positioning groove comprises a plurality of surfaces matching inclination angles of the first left side surface and the first right side surface, such that the surfaces of the positioning groove closely contact the first left side surface and the first right side surface of the positioning member when the laser module is fixed in the positioning groove.

22. The projector according to claim 20, wherein the positioning member further comprises two side plate portions extending from the first rear surface of the main plate portion toward the first front surface along the first left side surface and the first right side surface, respectively, the two side plate portions and the main plate portion form a recess, the recess is configured to accommodate the laser unit, the two side plate portions are substantially parallel or inclined with respect to each other, the positioning groove comprises a plurality of surfaces matching inclination angles of the two side plate plates, such that the surfaces of the positioning groove closely contact the two side panel plates of the positioning member when the laser module is fixed in the positioning groove.

23. The projector according to claim 19, wherein a hardness of the laser module heat dissipation portion of the heat dissipation module is greater than a hardness of the positioning member.

24. The projector according to claim 19, wherein a hardness the laser module mounting portion of the optical engine module is greater than a hardness of the positioning member.

25. The projector according to claim 18, further comprising a dustproof material covering at least the positioning groove.

26. The projector according to claim 18, wherein the first lower surface of the main plate portion has a gap with a bottom of the positioning groove.

\* \* \* \* \*